(12) United States Patent
Correia et al.

(10) Patent No.: US 8,126,158 B2
(45) Date of Patent: Feb. 28, 2012

(54) REDUCING SOUND PRESSURE OF NOISE

(75) Inventors: Paul Correia, Antibes (FR); Laurent Le Faucheur, Antibes (FR); Xavier Lefevre, Villeneuve Loubet (FR)

(73) Assignee: Texas Instruments Incorporated, Dallas, TX (US)

( * ) Notice: Subject to any disclaimer, the term of this patent is extended or adjusted under 35 U.S.C. 154(b) by 1154 days.

(21) Appl. No.: 11/931,299

(22) Filed: Oct. 31, 2007

(65) Prior Publication Data

US 2008/0279392 A1 Nov. 13, 2008

(30) Foreign Application Priority Data

May 10, 2007 (EP) .................................... 07290586

(51) Int. Cl.
*H04B 15/00* (2006.01)

(52) U.S. Cl. .......................... 381/93; 381/94.1; 381/120
(58) Field of Classification Search ................... 381/93, 381/94.1, 120
See application file for complete search history.

(56) References Cited

U.S. PATENT DOCUMENTS 5,677,962 A * 10/1997 Harrison et al. .............. 381/109
2006/0215852 A1* 9/2006 Troxel ............................. 381/93
* cited by examiner

*Primary Examiner* — Phat X Cao
(74) *Attorney, Agent, or Firm* — John R. Pessetto; W. James Brady; Frederick J. Telecky, Jr.

(57) ABSTRACT

A system comprising converter logic that introduces noise to a signal. The system also comprises amplifier logic that reduces a sound pressure associated with the noise by amplifying the signal prior to providing the signal to the converter logic and de-amplifying the signal after providing the signal to the converter logic.

7 Claims, 4 Drawing Sheets

REDUCING SOUND PRESSURE OF NOISE

CROSS-REFERENCE TO RELATED APPLICATION

The present application claims priority to EP Application No. 07290586.2, filed on May 10, 2007, hereby incorporated herein by reference.

BACKGROUND

Many electronic devices (e.g., mobile communication devices) output audible sound. The audible sound may be in the form of speech, music, etc. Circuit logic in such electronic devices often adds noise to the sound. For example, some electronic devices contain digital-to-analog (D/A) converters. A D/A converter receives digital signals (e.g., associated with a digital music file) and converts the digital signals to analog form. The resulting analog signal is then output via an audio output device (e.g., headphones). However, D/A converters undesirably cause audible noise to be added to signals when converting the signals from digital to analog form.

SUMMARY

Accordingly, these are disclosed herein techniques for reducing the sound pressure of noise introduced to a signal by circuit logic. An illustrative embodiment includes a system comprising converter logic that introduces noise to a signal. The system also comprises amplifier logic that reduces a sound pressure associated with the noise by amplifying the signal prior to providing the signal to the converter logic and de-amplifying the signal after providing the signal to the converter logic.

Another illustrative embodiment includes a system comprising a digital amplifier that receives a signal, where the digital amplifier amplifies the signal by a value to product an amplified signal. The system also includes a digital-to-analog (D/A) converter that receives the amplified signal and converts the amplified signal from digital to analog form to produce a converted signal, where the D/A converter adds noise to the converted signal. The system further includes an analog amplifier that reduces a sound pressure of the noise by de-amplifying the signal by another value.

Yet another illustrative embodiment includes a method that comprises amplifying a first component of a signal to produce an amplified signal, where the first component has a first volume. The method also comprises adding a second component to the amplified signal, where the second component has a second volume. The method further comprises de-amplifying the signal by a gain factor so that the second volume is reduced by the gain factor.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical or wireless connection. Thus, if a first device couples to a second device, that connection may be through a direct electrical or wireless connection, or through an indirect electrical or wireless connection via other devices and connections. The term "connection" refers to any path via which a signal may pass. For example, the term "connection" includes, without limitation, wires, traces and other types of electrical conductors, optical devices, wireless pathways, etc. Further, the term "or" is meant to be interpreted in an inclusive sense rather than in an exclusive sense.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a technique that reduces the noise added to a signal by circuit logic (e.g., a digital-to-analog (D/A) converter). In particular, the technique comprises amplifying a signal prior to providing the signal to the noise-producing logic. The technique also comprises de-amplifying the signal after the noise-producing logic has added the undesirable noise to the signal. The signal is amplified and de-amplified by the same, or by a substantially similar, gain factor. By amplifying and de-amplifying the signal in this way, the sound pressure of any noise added by the noise-producing logic is "pushed down," or reduced, to inaudible or almost-inaudible levels. For ease of explanation, the rest of this disclosure assumes the noise-producing logic comprises a D/A converter, although the scope of this disclosure is not limited to any specific type of noise-producing logic.

Figure 1:
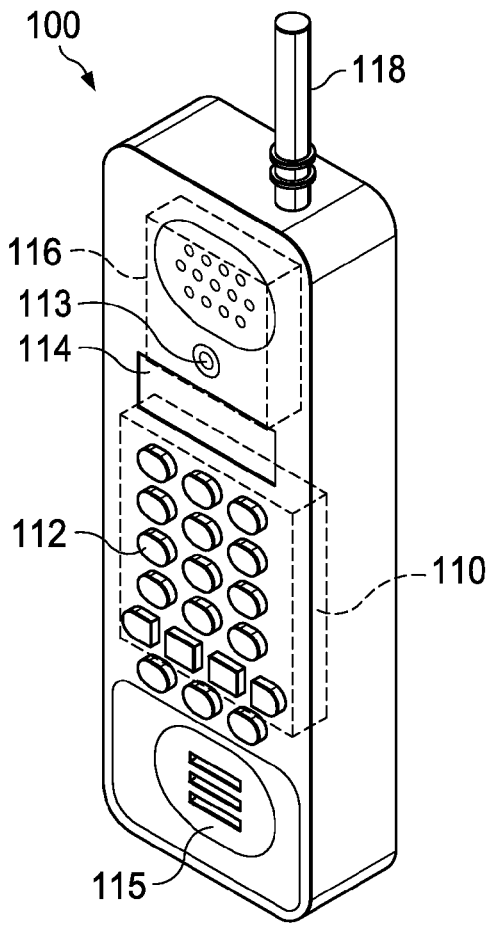
FIG. 1 shows an illustrative electronic device implementing the techniques disclosed herein, in accordance with various embodiments.

FIG. 1 shows an illustrative electronic device 100 (e.g., a mobile communication device such as a mobile phone) implementing the technique in accordance with embodiments of the invention. In some embodiments, the device 100 comprises a battery-operated device which includes an integrated keypad 112 and display 114. The device 100 also includes an electronics package 110 coupled to the keypad 112, display 114, and radio frequency ("RF") circuitry 116. The electronics package 110 contains various electronic components used by the device 100, including processing logic, storage logic, etc. The RF circuitry 116 may couple to an antenna 118 by which data transmissions are sent and received. Although the electronic device 100 is represented as a mobile phone in FIG. 1, the scope of this disclosure is not limited to mobile phones and also may include personal digital assistants, multi-purpose audio devices, digital music players, portable computers or any other mobile or non-mobile electronic device. In at least some embodiments, devices other than mobile communication devices are used.

Figure 2:
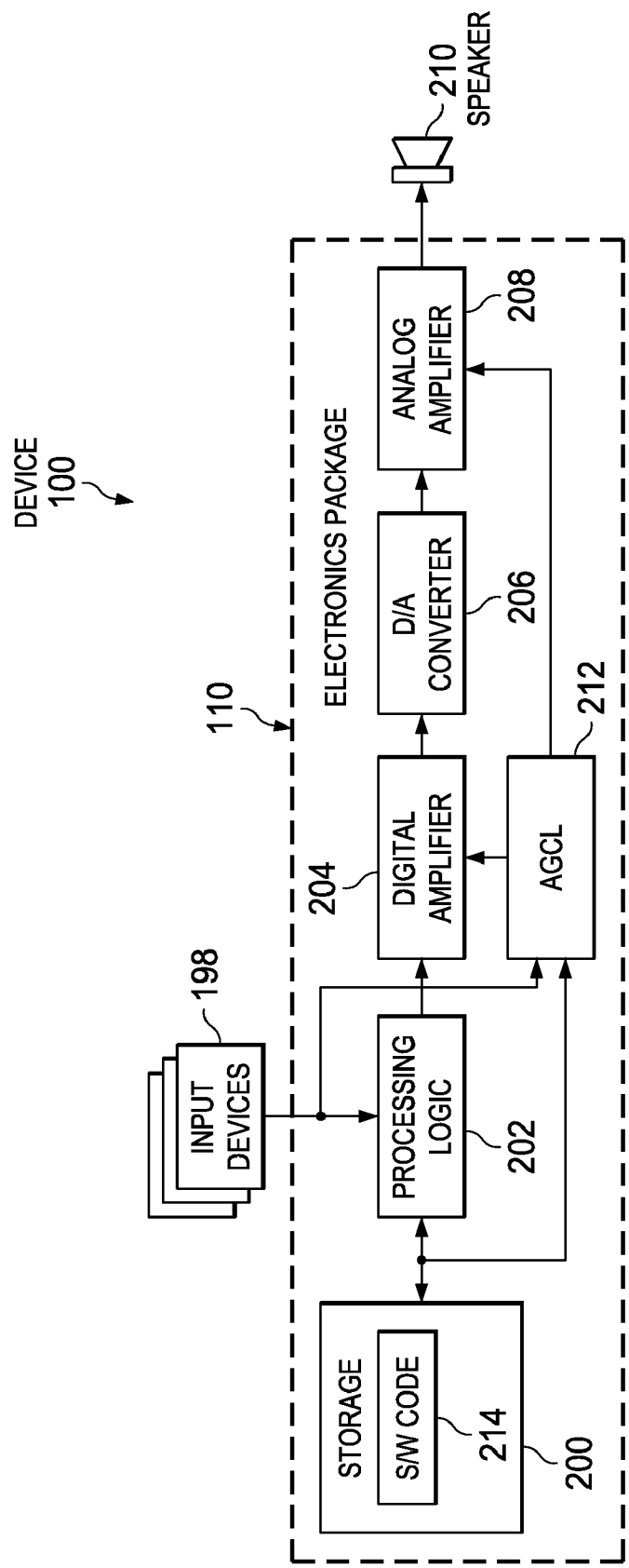
FIG. 2 shows an illustrative block diagram of circuit logic associated with the device of FIG. 1, in accordance with preferred embodiments.

FIG. 2 shows a block diagram of circuit logic housed within, or coupled to, the electronics package 110. The device 100 comprises one or more input devices 198, storage 200, processing logic 202, digital amplifier 204, digital-to-analog (D/A) converter 206, analog amplifier 208, speaker 210 and adaptive gain control logic (AGCL) 212. The digital amplifier 204 and analog amplifier 208 are collectively referred to as the "amplifier logic." The input devices 198 may comprise, for example, a transceiver (or, alternatively, a receiver) coupled to an antenna, an audio input device (e.g., microphone), etc. The storage 200 may comprise a processor (computer)-readable medium such as random access memory (RAM), volatile storage such as read-only memory (ROM), a hard drive, flash memory, etc. or combinations thereof. Although storage 200 is represented in FIG. 2 as being a single storage unit, in some embodiments, the storage 200 comprises a plurality of discrete storage units. The storage 200 comprises software code 214. The software code 214, when executed by the processing logic 202, causes the processing logic 202 to perform at least some of the techniques disclosed herein. The software code 214 may comprise one particular portion of code that performs a specific set of actions, multiple portions of code that perform various actions, etc.

In accordance with embodiments of the invention, the processing logic 202 receives a signal (e.g., a digital signal) from either an input device 198 or storage 200. A digital signal received from the input device 198 may comprise, for example, a signal received from a communication device via the RF circuitry 116 shown in FIG. 1. Alternatively, a digital signal received from the storage 200 may be associated with, for example, a digital music file (e.g., an MP3 file). The processing logic 202 may receive other types of signals from any of a variety of sources besides those explicitly shown in FIG. 2 or described herein. All such variations are included within the scope of this disclosure. Regardless of how a signal is provided to the processing logic 202, the same signal also is provided to the AGCL 212.

The processing logic 202 forwards the received signal to the digital amplifier 204. In some embodiments, other types of amplifiers or amplifying circuit logic may be used. In turn, the digital amplifier 204 amplifies the received signal. The degree to which the digital amplifier 204 amplifies the signal depends on the AGCL 212. The AGCL 212 comprises circuit logic that analyzes the magnitude of the received signal to determine the degree to which the digital amplifier 204 should amplify the received signal. The AGCL 212 may make this determination in any suitable manner. For example, the AGCL 212 may store and/or access a pre-programmed data structure cross-referencing various magnitude ranges with degrees of gain. In some embodiments, a received signal with a sound pressure magnitude greater than −9 dB is cross-referenced with a gain of 0; a sound pressure magnitude less than or equal to −9 dB but greater than −15 dB is cross-referenced with a gain of 6; a sound pressure magnitude less than or equal to −15 dB but greater than −21 dB is cross-referenced with a gain of 12; and a sound pressure magnitude less than or equal to −21 is cross-referenced with a gain of 18. Regardless of the gain level chosen, the AGCL 212 provides the target gain level to the digital amplifier 204 and to the analog amplifier 208.

In turn, the digital amplifier 204 receives the target gain level from the AGCL 212 and amplifies the received signal in accordance with the target gain level. The digital amplifier 204 then provides the amplified signal to the D/A converter 206. The D/A converter 206 converts the received signal from digital to analog form. However, in performing this conversion, the D/A converter 206 may undesirably add electrical noise to the signal. (Electrical noise will later be converted to "audible" noise by the speaker 210.) As previously mentioned, any noise-producing logic may be substituted for the D/A converter 206. The D/A converter 206 then provides the signal to the analog amplifier 208.

The analog amplifier 208 receives the signal and de-amplifies (or "attenuates") the signal. More specifically, the analog amplifier 208 de-amplifies the signal by a factor that is the same as, or substantially similar to, the degree by which the signal was amplified by the digital amplifier 204. For example, if the digital amplifier 204 amplifies a signal by a factor of 3, the analog amplifier 208 may attenuate the signal by a factor of 3 (i.e., amplify the signal by a factor of −3). This factor is provided to the analog amplifier 208 by the AGCL 212 and is determined based on the magnitude of the signal as provided to the processing logic 202. In some embodiments, a received signal with a sound pressure magnitude greater than −9 dB is cross-referenced with a gain of 0; a sound pressure magnitude less than or equal to −9 dB but greater than −15 dB is cross-referenced with a gain of −6; a sound pressure magnitude less than or equal to −15 dB but greater than −21 dB is cross-referenced with a gain of −12; and a sound pressure magnitude less than or equal to −21 is cross-referenced with a gain of −18. The analog amplifier then provides the resulting signal to the speaker 210 for output.

Figure 3A:
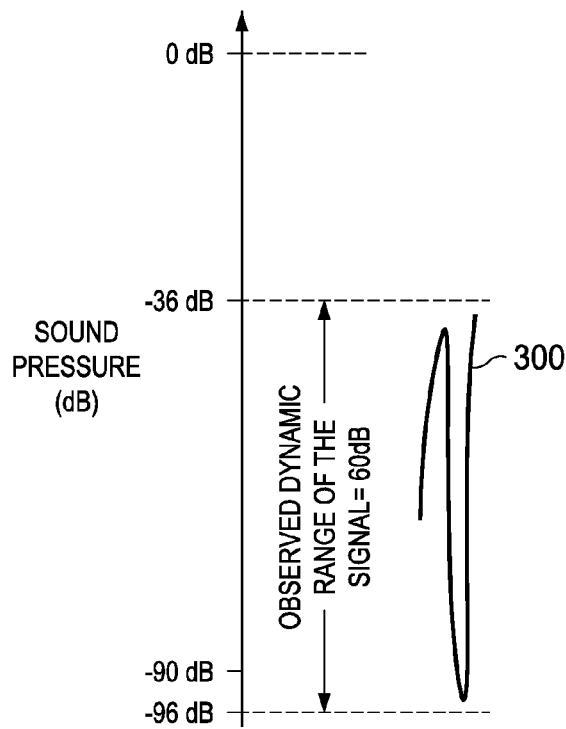
FIGS. 3a-3d show graphs demonstrating the effect of the circuit logic of FIG. 2 on a signal, in accordance with preferred embodiments.
Figure 3B:
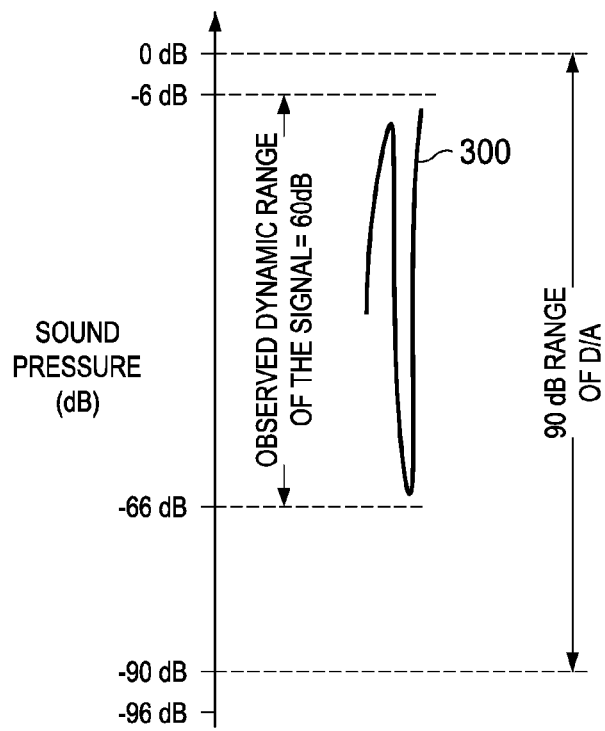
Figure 3C:
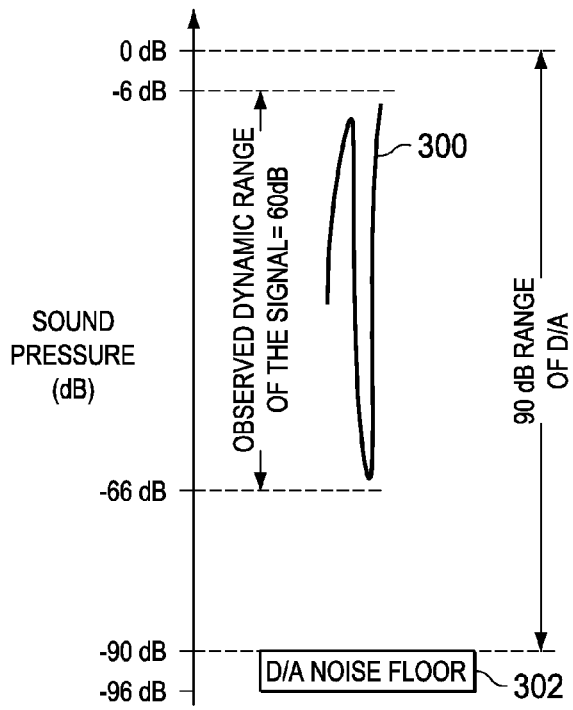

The digital amplifier 204, D/A converter 206 and analog amplifier 208 affect input signals as shown in FIGS. 3a-3d. Referring to FIGS. 2 and 3a, FIG. 3a shows an input signal 300 that is provided to the digital amplifier 204. As shown, the signal 300 has an illustrative dynamic sound pressure range of 60 dB. In particular, the sound pressure of the signal 300 ranges between −36 dB and −96 dB. FIG. 3b shows the input signal 300 after the digital amplifier 204 has applied an illustrative gain of +30 dB. Although the digital amplifier 204 has applied a +30 dB gain, any suitable gain level may be applied. The sound pressure of the signal 300 now ranges between −6 dB and −66 dB. FIG. 3c shows the signal 300 after the D/A converter 206 has converted the signal from digital to analog form. Although the signal 300 has been converted to analog form, the signal 300 is illustrated identically in FIGS. 3a-3d for ease of explanation. FIG. 3c shows a noise component 302 that has been added by the D/A converter 206. The noise component 302, also referred to as the "noise floor," has a sound pressure range of −90 dB and below. The presence or absence of the digital and analog amplifiers 204, 208 does not alter the sound pressure level at which the noise component 302 would exist. Stated otherwise, in the current example, even if one or both of the amplifiers 204 and 208 were removed, the D/A converter 206 would add the noise component with a sound pressure range of −90 dB and below. The significance of this fact is explained further below.

Figure 3D:
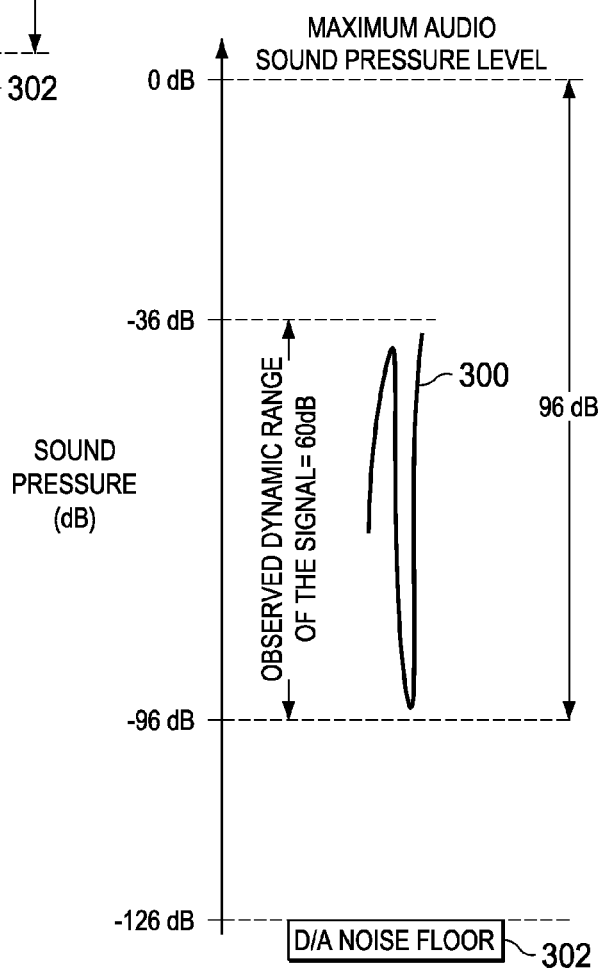

FIG. 3d shows the signal 300 after it has been de-amplified by the analog amplifier 208. The degree to which the analog amplifier 208 de-amplifies the signal 300 and the noise 302 preferably is the same as the degree to which the digital amplifier 204 amplified the signal 300. As a result, the signal 300 output by the analog amplifier 208 (shown in FIG. 3d) has the same sound pressure range it originally did (i.e., prior to being amplified by the digital amplifier 204). Stated otherwise, the signal 300 enters the digital amplifier 204 and leaves the analog amplifier 208 with the same dynamic sound pressure range because the signal 300 is both amplified by +30 dB and is de-amplified by +30 dB (i.e., amplified by −30 dB). Thus, the sound pressure associated with the signal 300 does not change. However, the noise component 302 output by the analog amplifier is not amplified by the digital amplifier 204, since it is introduced by the D/A converter 206. Instead, the noise component 302 is de-amplified by the analog amplifier 208 (although it is possible for the noise component 302 to be amplified). Because the noise component 302 generally undergoes only de-amplification and not amplification, the sound pressure of the noise component 302 is reduced by 30 dB, as shown in FIG. 3d. Thus, the net effect of the system shown in FIG. 2 is a substantial decrease of the sound pressure of noise 302 with no change in the sound pressure of the signal 300. The signal-to-noise ratio (SNR) is thereby decreased.

In some embodiments, the gain levels applied by the digital amplifier 204 and the analog amplifier 208 may vary as desired. For example, the digital amplifier 204 may apply a gain of +30 dB while the analog amplifier 208 applies a gain of −25 dB. In such cases, a net signal gain of +5 dB is realized while the noise floor is still "pushed down," or reduced, by 25 dB.

The technique described above preferably is implemented when the volume of signal 300 decreases from a high volume to a low volume. This is because the technique described above may, in some instances, introduce a "glitch" or noise disturbance. However, if the technique is implemented when the signal volume is decreased, the glitch goes undetected by the human ear. The ear fails to detect the glitch because the ear has a "masking effect." This masking effect prevents the ear from hearing quiet sounds for several milliseconds (e.g., up to five seconds) after a large volume drop. The AGCL 212 may be programmed to switch gain levels from 0 when the AGCL 212 detects a drop in signal volume of at least a predetermined degree.

Although the embodiments described above comprise D/A converters, digital amplifiers and analog amplifiers, the scope of this disclosure is not limited to any particular type of circuit logic. Any suitable circuit logic that is able to apply a gain may be used in lieu of the digital amplifier 204. Similarly, any noise-producing circuit logic may be used in place of the D/A converter 206. Likewise, any circuit logic that is able to apply a gain (i.e., de-amplify a signal) may be used instead of the analog amplifier 208. Any and all possible variations and permutations are encompassed within the scope of this disclosure.

Figure 4:
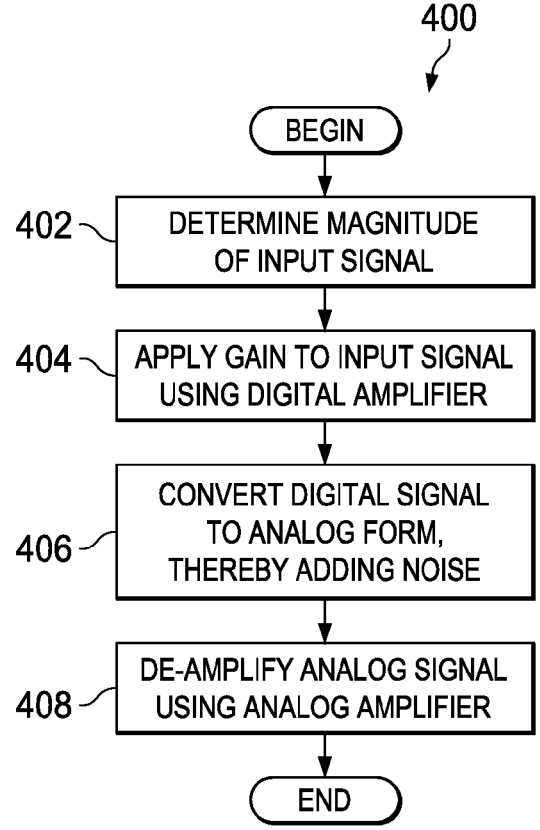
FIG. 4 shows a flow diagram implementing a method in accordance with various embodiments.

FIG. 4 shows a flow diagram of a method 400 implemented in accordance with various embodiments. The method 400 begins by determining a magnitude of an input signal (block 402). The method 400 continues by applying a gain to the input signal using a digital amplifier, where the gain level is determined based on the magnitude of the input signal (block 404). The method 400 further comprises converting the digital signal to analog form (block 406). As explained, such a conversion adds noise to the signal. The method 400 then comprises de-amplifying the analog signal (block 408). The degree to which the analog signal is de-amplified varies. In some embodiments, however, the digital amplifier amplifies the signal, and the analog amplifier de-amplifies the signal, by the same factor.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
   a digital amplifier that receives a signal, the digital amplifier amplifies the signal by a first value to produce an amplified signal;
   a digital-to-analog (D/A) converter that receives the amplified signal and converts the amplified signal from digital to analog form to produce a converted signal, the D/A converter adds noise to the converted signal to produce a noisy signal;
   an analog amplifier that increases the signal-to-noise ratio (SNR) of the noisy signal by reducing a sound pressure of said noise via the de-amplification of the noisy signal by a second value.

2. The system of claim 1, wherein said first and second values are identical.

3. The system of claim 1 further comprising an adaptive gain control logic that adaptively adjusts said value and said another value according to a magnitude of the signal.

4. The system of claim 3 wherein said adaptive gain control logic adjusts said value and said another value from 0 when the adaptive gain control logic determines that said magnitude decreases.

5. The system of claim 3, wherein said adaptive gain control logic adjusts said value and said another value to 0 when the adaptive gain control logic determines that said magnitude increases.

6. The system of claim 1, wherein the system comprises a device selected from the group consisting of a mobile communication device and a digital audio device.

7. A method, comprising:
   amplifying a signal to produce an amplified signal;
   adding a noise component to the amplified signal, the noise component having a volume; and
   de-amplifying the signal by a gain factor so that the volume is reduced by said gain factor;
   wherein said de-amplification causes a signal-to-noise ratio (SNR) of the signal to increase;
   wherein amplifying said signal comprises using a digital amplifier and de-amplifying the signal comprises using an analog amplifier.

* * * * *